United States Patent
Matei et al.

(10) Patent No.: US 11,043,951 B2
(45) Date of Patent: Jun. 22, 2021

(54) ANALOG COMPUTER ARCHITECTURE FOR FAST FUNCTION OPTIMIZATION

(71) Applicant: Palo Alto Research Center Incorporated, Palo Alto, CA (US)

(72) Inventors: Ion Matei, Sunnyvale, CA (US); Aleksandar Feldman, Santa Cruz, CA (US); Johan de Kleer, Los Altos, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days.

(21) Appl. No.: 16/206,206

(22) Filed: Nov. 30, 2018

(65) Prior Publication Data

US 2020/0177186 A1   Jun. 4, 2020

(51) Int. Cl.
*H03K 19/17748* (2020.01)
*G06G 7/122* (2006.01)
*G06G 7/32* (2006.01)

(52) U.S. Cl.
CPC ....... *H03K 19/17748* (2013.01); *G06G 7/122* (2013.01); *G06G 7/32* (2013.01)

(58) Field of Classification Search
None
See application file for complete search history.

(56) References Cited

U.S. PATENT DOCUMENTS

| | | | | |
|---|---|---|---|---|
| 4,485,434 A * | 11/1984 | Beeston | ............... | H02M 7/5387 315/DIG. 7 |
| 6,188,974 B1 * | 2/2001 | Cullum | .................. | G06F 30/367 703/14 |
| 7,024,654 B2 * | 4/2006 | Bersch | .................... | G06F 30/34 716/117 |
| 8,356,000 B1 * | 1/2013 | Koza | ....................... | G06N 3/126 706/13 |
| 9,484,745 B2 * | 11/2016 | Johnson | .................... | H02J 3/38 |
| 9,755,822 B2 * | 9/2017 | Han | ........................ | H04L 9/003 |
| 2007/0296383 A1 * | 12/2007 | Xu | .......................... | H02M 1/14 323/282 |
| 2013/0106462 A1 * | 5/2013 | Yang | .................... | H03K 19/177 326/39 |
| 2013/0223651 A1 * | 8/2013 | Hoyerby | ............... | H03F 3/2173 381/120 |

* cited by examiner

*Primary Examiner* — Amy Cohen Johnson
*Assistant Examiner* — James H Cho
(74) *Attorney, Agent, or Firm* — Womble Bond Dickinson (US) LLP

(57) ABSTRACT

An analog circuit for solving optimization algorithms comprises three voltage controlled current sources and three capacitors, operatively coupled in parallel to the three voltage controlled current sources, respectively. The circuit further comprises a first inductor, operatively coupled in series between a first pair of the capacitors and the voltage controller current sources and a second pair of the capacitors and the voltage controller current sources. The circuit further comprises a second inductor, operatively coupled in series between the second pair of the capacitors and the voltage controller current sources and a third pair of the capacitors and the voltage controller current sources.

18 Claims, 11 Drawing Sheets

ANALOG COMPUTER ARCHITECTURE FOR FAST FUNCTION OPTIMIZATION

TECHNICAL FIELD

Implementations of the present disclosure related to analog computer architecture for fast function optimization.

BACKGROUND

In computer systems, optimization problems are typically solved using digital devices that run iterative algorithms. An optimization problem is the problem of finding the best solution from all, or a set of, feasible solutions. Optimization problems can be divided into two categories depending on whether the variables are continuous or discrete. An optimization problem with discrete variables is known as a discrete optimization. In a discrete optimization problem, an object such as an integer, permutation or graph from a finite (or possibly countably infinite) set is sought. Problems with continuous variables include constrained problems and multimodal problems.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
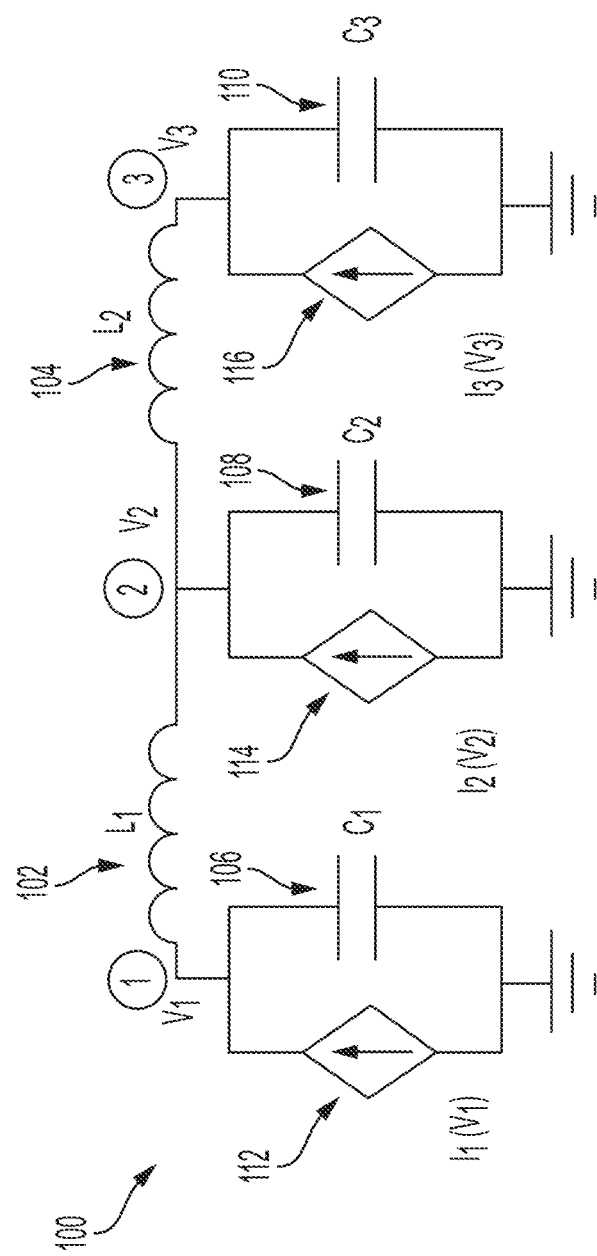
FIG. 1 is a circuit diagram of an electrical implementation of analog computer architecture for fast function optimization, in accordance with some embodiments.

In computer systems, optimization problems are typically solved using digital devices that run iterative algorithms. For real time applications, such as model predictive control, the optimization solutions should be computed at kilo-hertz rates. Disadvantageously, such rates are not always possible using digital implementations. Thus, a better solution to the problem is sought. Analog computing systems and methods, such as those described in the embodiments described herein, have the potential to address this challenge, possibly being able to provide an answer in milli- to nano-seconds. In some embodiments, previous analog computers aimed at solving optimization problems may be limited to solving linear and quadratic problem sets. Advantageously, by using the distributed optimization framework described herein, architecture based on distributed optimization enables circuit programmability.

The present disclosure provides systems and operations that leverage the distributed optimization framework to generate analog implementations of optimization algorithms for arbitrary functions. Embodiments of mappings of the distributed optimization framework to a physical realization using electrical components are provided. The steady state of some particular component potentials provides the solution of the optimization problem. Unlike realizations of centralized optimization algorithms, the distributed framework advantageously: makes the PCB less cluttered, more robust to faults; deals better with the uncertainty in components due to the averaging nature of the algorithms; and fits more naturally into the networked structure of a field-programmable analog arrays (FPPAs). In addition, the building blocks for the realization of a FPPA dedicated to solving optimization problems is provided herein. In various embodiments described herein, the FPPA architecture and building blocks enable programmability, the ability to change the objective function that is minimized.

As described herein, optimization algorithms may be used in applications related to network resource allocation, collaborative control, state estimation and system identification. In one exemplary embodiment of a distributed optimization setup, it may be assumed that a group of N agents interact with each other through a communication topology modeled as an undirected communication graph $\mathcal{G} = (v, \varepsilon)$. Using the usual notations, $v=\{1, 2, \ldots, N\}$ is the set of nodes and $\varepsilon=\{e_{ij}|i,j=1, \ldots, N, i \neq j\}$ is the set of edges. An edge between two nodes i and j means that agents i and j may exchange information (e.g., can cooperate). The set of neighbors of agent i may be denoted by $\mathcal{N}_i \triangleq \{j|e_{ij} \in \varepsilon\}$. In one embodiment, a particular type of objective function $f: \mathbb{R}^n \to \mathbb{R}$ may be assumed formulated as: $f(x) = \sum_{i=1}^{N} f_i(x)$.

In one embodiment, the common goal of the agents is to solve the following optimization problem:

$$(P_1) \min_{x \in \mathbb{R}^n} f(x),$$

where it is assumed that there exists at least one local minimizer. Distributed numerical algorithms may be used to solve $(P_1)$, whose convergence rate depends in part on the communication topology. In one embodiment, the more connected the agents are, the faster the algorithms converge. Distributed algorithms can be used for setups ranging from unconstrained, to constrained or stochastic cases.

In one embodiment, it is desirable for real time applications to achieve results in a short amount of time (e.g., in model predictive control schemes). This is not always possible using digital devices. In one embodiment, results may be obtained significantly faster using analog computers that can potentially generate results in micro- to nanoseconds. In one embodiment, electronic circuits are a fast and cheap way to design and implement solutions to the problems described herein. It is not trivial to implement an arbitrary function with analog devices. Reasonable approximations can be made, however, where the objective function is approximated as a sum of other functions. Such embodiments may be highly efficient at solving optimizations as part of a model-predictive control scheme.

For example, in one embodiment, piecewise linear approximations may be used. For example, in the scalar case $f(x)$ may be approximated as: $f(x) \approx \sum_{i=1}^{N} f_i(x)$, where $f_i(x) = a_i x + b_i$ for $x \in [z_i, z_{i+1}]$, where $z_i$ are points on the domain of $f$. Alternatively, polynomial interpolations may be used, resulting in the approximation: $f(x)$ with $f_i(x) = a_i x^i$.

For such simpler representations, there may exist a better chance of finding physical realizations of an optimization algorithm. In one embodiment, the function approximation fits exactly the distributed optimization setup. Advantageously, realizing distributed optimization algorithms via analog circuits as compared to centralized versions may: make the PCB less cluttered, more robust to faults, (e.g., copies of the functions $f_i$ may be added for redundancy); deal better with the uncertainty in components due to the averaging nature of the algorithms; and fit more natural into the networked structure of field-programmable analog arrays (FPAAs). The latter may be integrated circuits based on a set of analog building blocks connected through a network of programmable switches similar to the FPAAs of the digital domain.

One advantage of FPAAs is re-configurability—e.g., by controlling the switches new electrical circuits may be generated. This may be particularly advantageous in the context of the problems described herein, since the FPAA may be programmed to work with different cost functions. As described herein, distributed optimization algorithms may be realized with electronic components.

It should be noted that as described herein, the gradient and Hessian of $f(x)$ with respect to x is denoted by $\nabla f(x)$ and $\nabla^2 f(x)$, respectively. The notation $x' = [x_1, \ldots, x_N]$ represents a vector with N vector components. The $i^{th}$ vector component of x is $x_i$. The $j^{th}$ entry of $x_i$ is denoted by $x_{ij}$. For a matrix $A = (a_{ij})$, $a_{ij}$ represents the entry at row i and column j. Symbol $\otimes$ denotes the Kronecker product.

In one embodiment, to derive a distributed optimization algorithm, the following steps may be performed. In one embodiment, the function: $F: R^{nN} \to R$ is defined, given by $F(x) = \sum_{i=1}^{N} f_i(x_i)$, where $x' = (x_1', x_2', \ldots, x_N')$, with $x_i \in R^n$. In addition the vector-valued function: $g(x) = (g_{ij}(x)), i \in \{1, \ldots, N\}, j \in \mathcal{N}_i$, with $g_{ij}: R^{nN} \to R^n$ given by $g_{ij}(x) = d_{ij}(x_i - x_j)$, where $d_{ij}$ are positive scalars. The vector-valued function $g(x)$ may be compactly expressed as $g(x) = Dx$, where $D = (d_{ji})$, $D = \bar{D} \otimes I$, with I the n-dimensional identity matrix. The optimization problem may then be defined as:

$$(P_2) \min_{x \in R^{nN}} F(x), \quad (1)$$

$$g(x) = Dx = 0. \quad (2)$$

In one embodiment, the following assumptions may be made on the functions $f_i(x)$ and on the communication model. Assumption 2.1:
1) Functions $f_i(x)$, $i=1 \ldots ; N$ are twice continuously differentiable;
2) Agent i has knowledge of only function $f_i(x)$ and scalars $d_{ij}$, for $j \in \mathcal{N}_i$;
3) Agent i can exchange information only with agents belonging to the set of its neighbors $N_i$;
4) The communication graph G is connected.

In one embodiment, a set of results leading to the formulation of the first order necessary conditions for $(P_2)$ is presented. The following proposition states that by solving $(P_2)$ we solve in fact $(P_1)$ as well, and vice-versa. Proposition 2.1: Let Assumptions 2.1 hold. The vector x* is a local minimizer of $(P_1)$ if and only if $x^* = 1 \otimes x^*$ is a local minimizer of $P_2$. Let $x^* = 1 \otimes x^*$ denote a local minimizer of $P_2$. From the theory concerning optimization problems with equality constraints, the first order necessary conditions for $(P_2)$ ensure the existence of the scalar $\lambda_0$ and vector $\lambda^*$ so that $\lambda_0 \nabla F(x^*) + D'\lambda^* = 0$. Note that since D is not full rank, the uniqueness of $\lambda^*$ cannot be guaranteed. The following result characterizes the set of Lagrange multipliers verifying the first order necessary conditions of $(P_2)$.

In one embodiment, to find a solution of problem $(P_2)$ a set of necessary conditions may be solved:

$$\nabla F(x) + D'\lambda = 0, \quad (3)$$

$$Dx = 0. \quad (4)$$

In one embodiment, solving (3)-(4) does not guarantee finding a local minimizer, but at least the local minimizers are among the solutions of the above nonlinear system of equations. A first order method for solving (3)-(4) is:

$$x_{k+1} = x_k - \alpha[\nabla F(x_k) + D'\lambda_k], \quad (5)$$

$$\lambda_{k+1} = \lambda_k + \alpha D x_k, \quad (6)$$

where $\alpha > 0$ is chosen small enough to ensure the stability of the algorithm. Local convergence of the difference equations (5)-(6) is addressed in the next theorem. It states that under some assumptions on the functions $f_i(x)$, provided the initial values are close enough to a solution of the first order necessary conditions of $(P_2)$, and a small enough step-size is used, the sequence $\{x_k, \lambda_k\}$ converges to this solution.

In one embodiment, the physical implementations for finding the solution of (3)-(4) are described herein. In one embodiment, the continuous time version of (5)-(6) is:

$$\dot{x} = -[\nabla F(x) + D'\lambda], \quad (7)$$

$$\dot{\lambda} = Dx. \quad (8)$$

In one embodiment, analog devices whose stationary regimes represent the solution of the optimization problem are described herein. With the right choice of components, such analog devices have the potential to converge to a solution faster than digital implementations. The distributed structure of the optimization problem may be leveraged to come up with analog implementations based on relative simple components. An electrical implementation is described with respect to FIG. 1.

FIG. 1 is a circuit diagram of an electrical implementation of the analog computer architecture for fast function optimization, in accordance with some embodiments. In one embodiment, circuit 100 has two inductors 102 and 104, three capacitors 106, 108, 110, and three voltage controlled current sources (VCCSs) 112, 114, 116. The currents through the inductors are denoted by $I_{L_1}$ and $L_{L_2}$, while the currents through the capacitors are denoted by $I_{C_1}$, $I_{C_2}$ and $I_{C_3}$, respectively. The behavior of the circuit (with some implicit current directions) is described by the following equations:

$$C_1 \frac{dV_1}{dt} = -I_1(V_1) - I_{L_1},$$

$$C_2 \frac{dV_2}{dt} = -I_2(V_2) - I_{L_2} + I_{L_1},$$

$$C_3 \frac{dV_3}{dt} = -I_3(V_3) - I_{L_2},$$

$$L_1 \frac{dI_{L_1}}{dt} = V_1 - V_2,$$

$$L_2 \frac{dI_{L_2}}{dt} = V_2 - V_3.$$

Assuming zero initial conditions for the inductor currents and equal inductance and capacitance values, the differential equations for the capacitor voltages can be written as $$\frac{dV_1}{dt} = -\left[\frac{1}{C}I_1(V_1) + \frac{1}{LC}\int_0^t (V_1 - V_2)d\tau\right]$$

$$\frac{dV_2}{dt} = -\left[\frac{1}{C}I_2(V_2) + \frac{1}{LC}\int_0^t (2V_2 - V_3 - V1)d\tau\right]$$

$$\frac{dV_3}{dt} = -\left[\frac{1}{C}I_3(V_3) + \frac{1}{LC}\int_0^t (V_3 - V2)d\tau\right],$$

or in matrix form $$\frac{dV}{dt} = -\frac{1}{C}I_v(V) - \frac{1}{LC}\mathcal{L}\int_0^t V d\tau, \qquad (9)$$

where $V' = [V_1, V_2, V_3]$, $I_v(V) = [I_1(V_1), I_2(V_2), I_3(V_3)]$, and $\mathcal{L}$ is a Laplacian like matrix $$\mathcal{L} = \begin{bmatrix} 1 & -1 & 0 \\ -1 & 2 & -1 \\ 0 & -1 & 1 \end{bmatrix},$$

The Laplacian can be decomposed as $\mathcal{L} = \frac{1}{2}\mathcal{D}'\mathcal{D}$, with $$\mathcal{D} = \begin{bmatrix} 1 & -1 & 0 \\ -1 & 1 & 0 \\ 0 & 1 & -1 \\ 0 & -1 & 1 \end{bmatrix}.$$

Introducing $$\lambda = \frac{1}{\sqrt{2LC}} \mathcal{D} \int_0^t V(\tau)d\tau:$$

$$\frac{dV}{dt} = -\frac{1}{C}I_v(V) - \frac{1}{\sqrt{2LC}}\mathcal{D}'\lambda, \qquad (10)$$

$$\frac{d\lambda}{dt} = \frac{1}{\sqrt{2LC}}\mathcal{D}V, \qquad (11)$$

Figure 2:
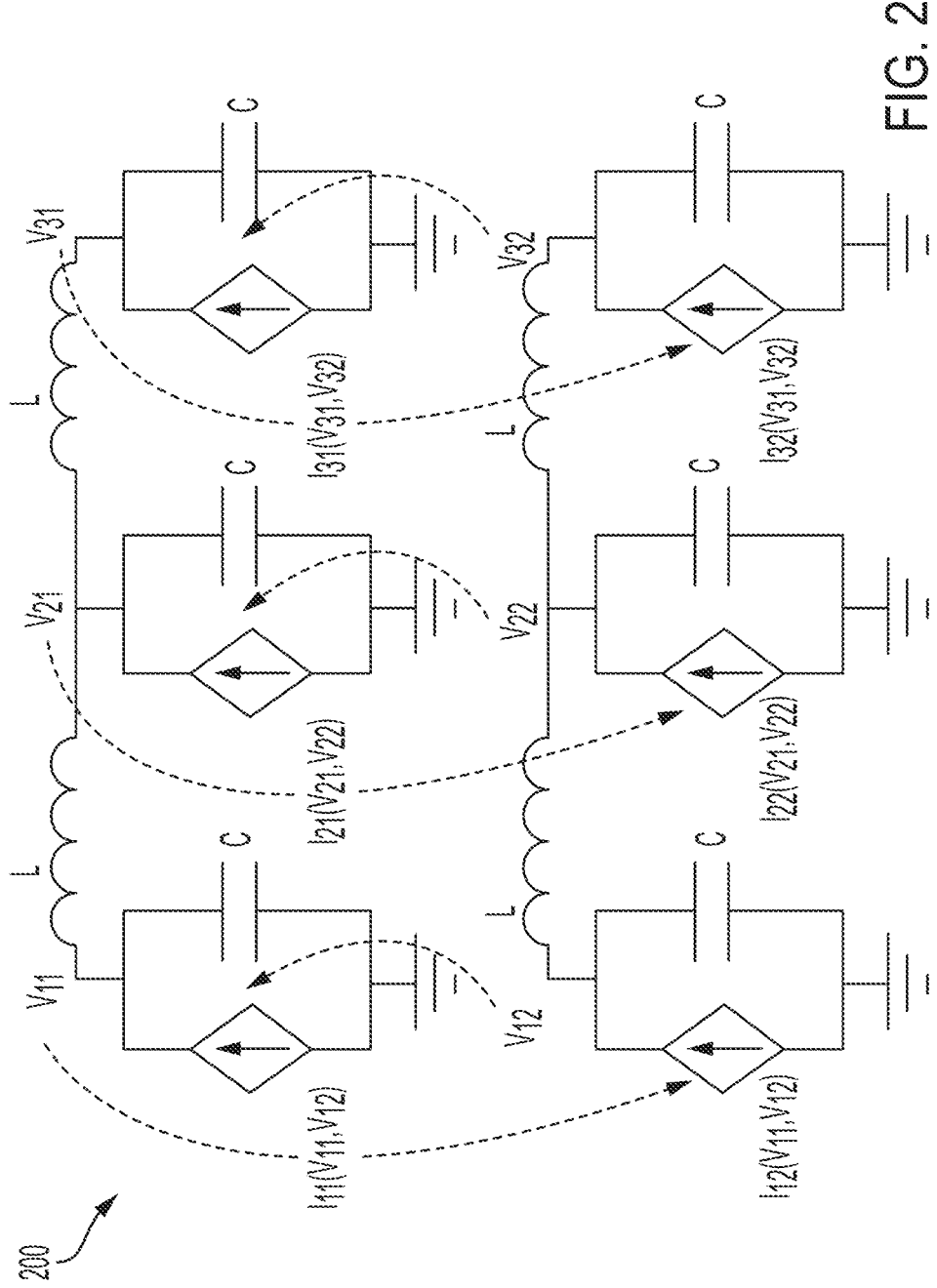
FIG. 2 is a circuit diagram of an electrical implementation for solving a distributed optimization problem, in accordance with some embodiments.

By making the additional notations x=V, $$D = \frac{1}{\sqrt{2LC}}\mathcal{D} \text{ and } \frac{1}{C}I_v(V) = \nabla F(x),$$

the continuous dynamics (7)-(8) may be recovered, for the scalar case. In one embodiment, the cost function may be scaled without affecting the minimum: if x* minimizes F(x) then it minimizes cF(x) as well, for any positive c. In other words, with $I_v(V) = C\nabla F(x)$, the steady state is not affected, which may protect against having to generate unreasonable current values. Hence, C and L may be chosen such that the circuit reaches steady state quickly. Therefore, the optimization variables correspond to capacitor voltages, the Lagrangian variables correspond to (copies) of inductor currents, and the gradients correspond to scaled VCCSs. This idea can be extended to the multivariable case. FIG. 2 builds on the previous example and depicts the electric circuit for solving an optimization variable with a cost function with two variables.

FIG. 2 is a circuit diagram of an electrical implementation for solving a distributed optimization problem, in accordance with some embodiments. In one embodiment, circuit 200 is two circuits (such as that described with respect to FIG. 1) with the same structure coupled through the capacitor potentials that control the current sources. For n optimization variables, the structural map from the communication graph in the distributed optimization setup to the circuit that solves the optimization problem is shown in FIG. 3.

Figure 3:
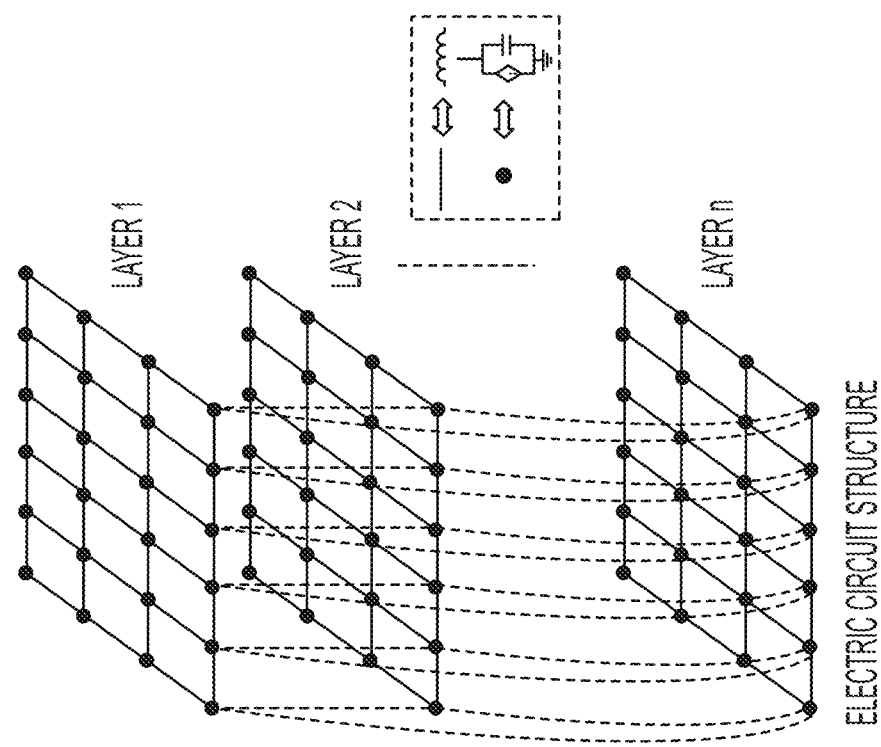
FIG. 3 is a mapping of the communication graph to an electronic circuit structure, in accordance with some embodiments.
Figure 3:
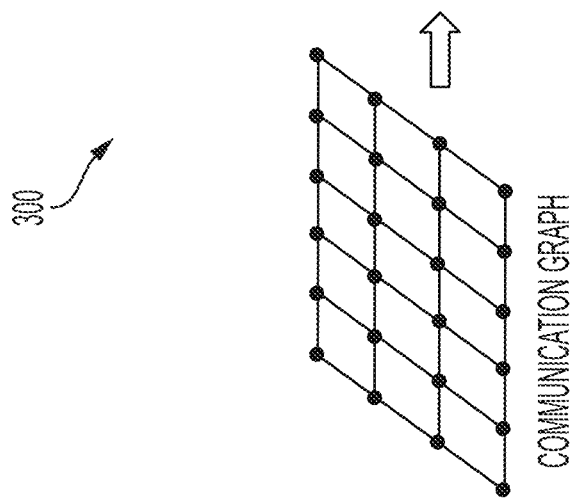

FIG. 3 is a mapping 300 of the communication graph to an electronic circuit structure, in accordance with some embodiments. In one embodiment, the electric circuit has n topological identical layers (e.g., layers 1-n). For each vertex in the communication graph there exists a pin in the electric circuit at each layer. For each edge $e_{ij}$ there exists an inductor between pins i and j at every layer. In in one embodiment, each pin is connected to a capacitor and a current source in parallel. The current source is controlled by the capacitors' potentials at similar positions in the layer. This is depicted with dotted connections in FIG. 3, where, for clarity, only the dotted connections for bottom, border nodes are illustrated.

In one embodiment, let $x' = [x_1, \ldots, x_N]$, with $x_i \in \mathbb{R}^n$ and $x_{ij}$ the $j^{th}$ entry of $x_i$. In the electrical circuit, j corresponds to a layer j, and i corresponds to pin i. The variable $x_{ij}$ corresponds to the potential of pin i at layer j. In one embodiment, the gradient of the cost function in (P$_2$) can be written as $\nabla F(x)' = [\nabla f_1(x)', \ldots, \nabla f_N(x)'] = [\nabla f_1(x_1)', \ldots, \nabla f_N(x_N)']$. The $j^{th}$ entry of $\nabla f_i(x_i)$ is denoted by $\nabla f_{ij}(x_i)$ and it corresponds to the voltage controlled current source at pin i and layer j. Note that $\nabla f_{ij}(x_i)$ is a function of $x_i$ and hence of all potentials at pin i across all n layers.

Figure 4:
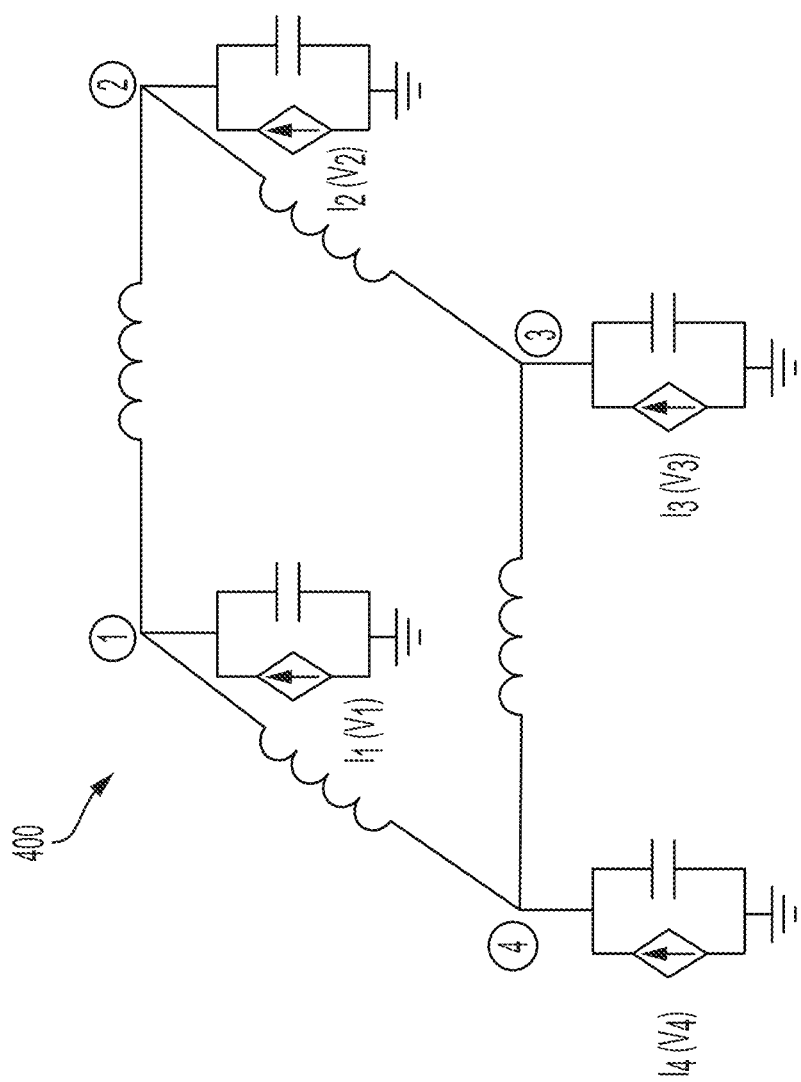
FIG. 4 is a circuit diagram of an electrical implementation for solving a distributed optimization problem according to a provided example, in accordance with some embodiments.

FIG. 4 is a circuit diagram of an electrical implementation for solving a distributed optimization problem according to a provided example, in accordance with some embodiments. In one example, FIG. 4 depicts the electric circuit 400 for minimizing a 4th order degree polynomial function $f(x) = a_4x^4 + a_3x^3 + a_2x^2 + a_1x + a_0$, with $a_4 = 0.2$, $a_3 = 0.05$, $a_2 = 1.5$, $a_1 = -1$ and $a_0 = 0.7$. The cost function of the augmented optimization problem may be written as $F(x)=f_4(x)+f_3(x)+f_2(x)+f_1(x)$ with $f_4(x)=a_4x_4^4$, $f_3(x)=a_3x_3^3$, $f_2(x)=a_2x_1^2$, and $f_i(x)=a_1x_1+a_0$.

The electric circuit 400 used to calculate the minimizer of $f(x)$ is shown in FIG. 4, where a grid like topology was selected. In one embodiment, the more connected the nodes are, the fastest convergence in reached. The current sources implement the gradients for the functions $f_i$: $I_1(V_1)=ca_1$, $I_2=c2a_2V_2$, $I_3=c3a_3V_3^2$, $I_4=c4a_4V_4^3$, where c is a scaling parameter that ensures the currents are within realizable physical limits. By choosing appropriate values for L, C and c, a suitable trade-off between the transient time of the circuit and the physical realizability of the circuit may be achieved.

Figure 5:
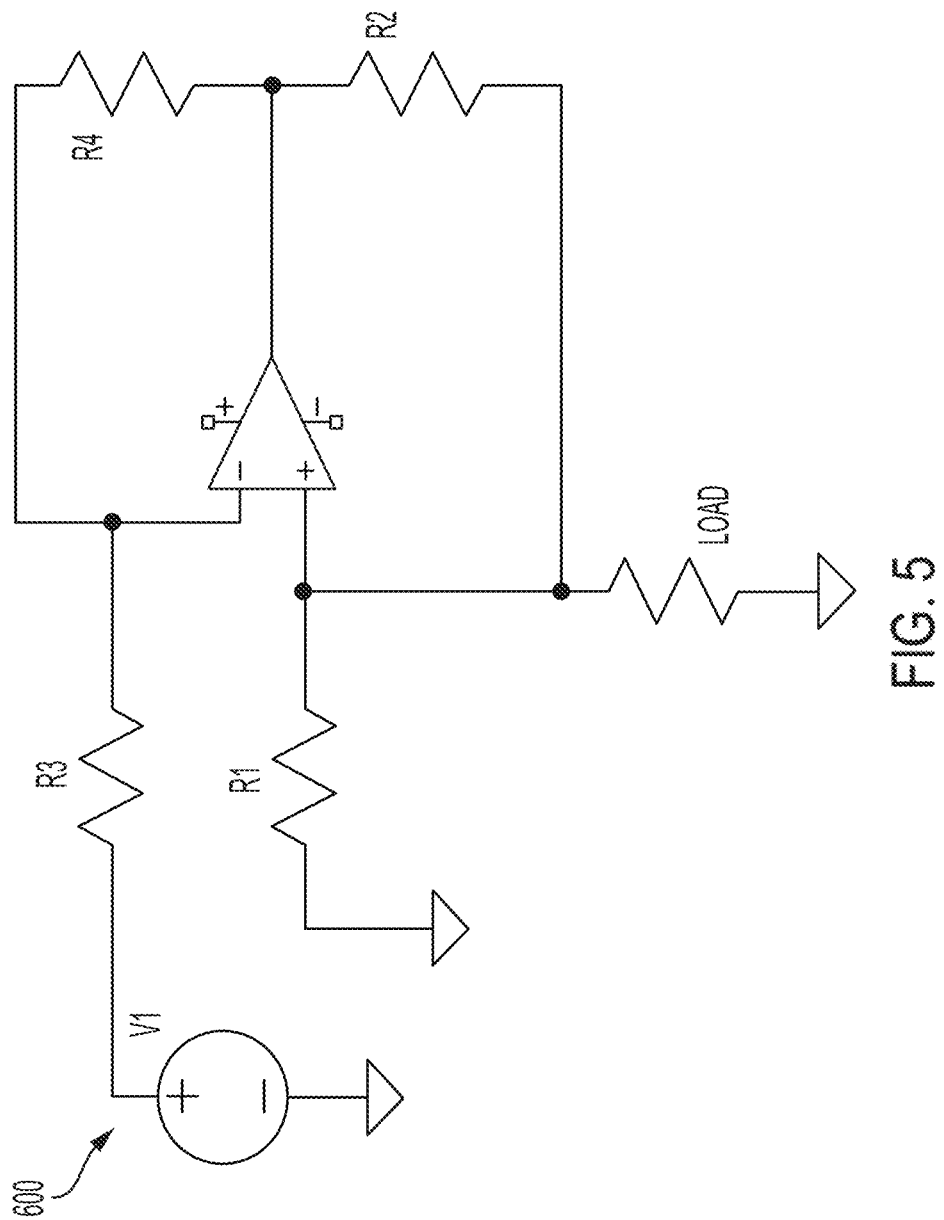
FIG. 5 is a circuit diagram of a Howland current pump, in accordance with some embodiments.

FIG. 5 is a circuit diagram of a Howland current pump 600, in accordance with some embodiments. In one embodiment, for non-convex cases, iterations (5)-(6) may converge to one of the possibly multiple local minimizers based on the initial values. An avenue for finding the best such local minimizer may be to try several initial conditions and evaluate the objective function. This procedure can be numerically expensive. This challenge may be overcome by implementing a physical device capable of finding local minimizers very fast. In the context of the electrical circuit discussed with respect to FIG. 1, changing the initial conditions may amount to setting different values for the initial potentials of the capacitors.

Described herein is a practical realization of an electrical circuit that can be used to solve distributed optimization problems. The circuit consists of an interconnected topology of analog cells, where the topology is generated through a FPAA. The FPAA may contain a set of building blocks. One such building block is the voltage controlled current source cell. FIG. 5 shows a single cell implementing a linear function $g(x)=ax$, where $g(x)$ is a current quantity and x is a voltage quantity. The function $g(x)$ can be thought as the gradient of a quadratic function that is a term in the cost function. The implementation is based on the Howland current pump of FIG. 5.

In one embodiment, the current through the load $$I_{load} = \frac{1}{R1}V_1.$$

The constant current source can be implemented by using the Howland current pump, connected to a constant voltage source and choosing appropriate values for the resistors to realize the desired current output. To achieve the linear relation between the output current and the input voltage, the current pump design may be such that that $$\frac{R1}{R2} = \frac{R3}{R4}).$$

Figure 6:
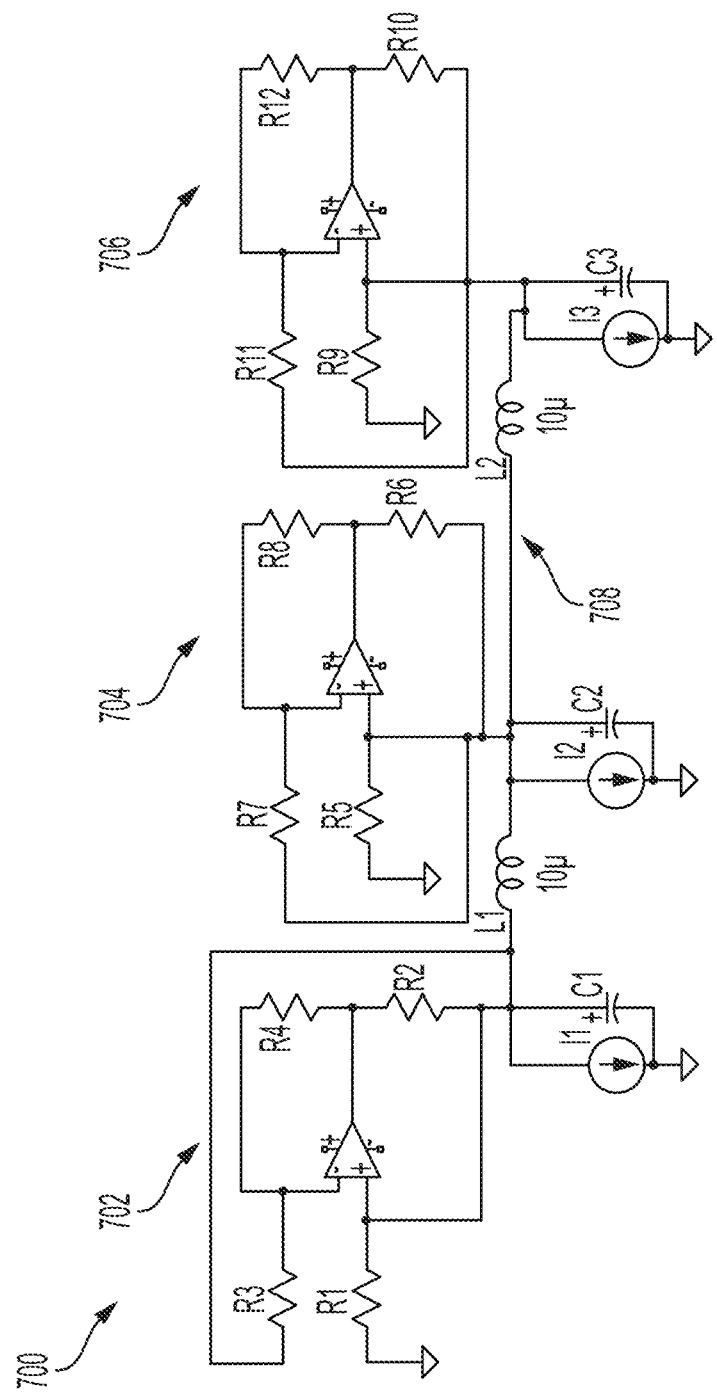
FIG. 6 is a circuit diagram of linear function cells connected to a bus, in accordance with some embodiments.

FIG. 6 is a circuit diagram of linear function cells connected to a bus, in accordance with some embodiments. Circuit 700 of FIG. 6 shows three cells 702, 704, 706 connected to a bus 708. In one embodiment, FIG. 6 is one implementation of a model of the circuit shown in FIG. 1, when the terms in the cost function are quadratic. The steady state voltage measured at the negative inputs of the op-amps is the root of the equation $g(x)=(a_1x+b_1)+(a_2x+b_2)+(a_3x+b_3)$. In a practical implementation, the current source $I_1$ may be replaced with another "constant" cell which is also a Howland current pump with a constant input voltage. A physical implementation of the FPAA may use non-ideal operational amplifiers (OP AMP). In one embodiment, the amplifiers may be powered from a clean voltage source (and not in saturation mode).

Such an implementation may provide ranges for the optimization problems. These ranges can be pre-computed when the design of the FPAA chip is finished. In one embodiment, the Howland current pump implements linear relations between the input voltage and the output current. With higher order terms in the cost function, additional components may be utilized as part of the FPAA.

Figure 7:
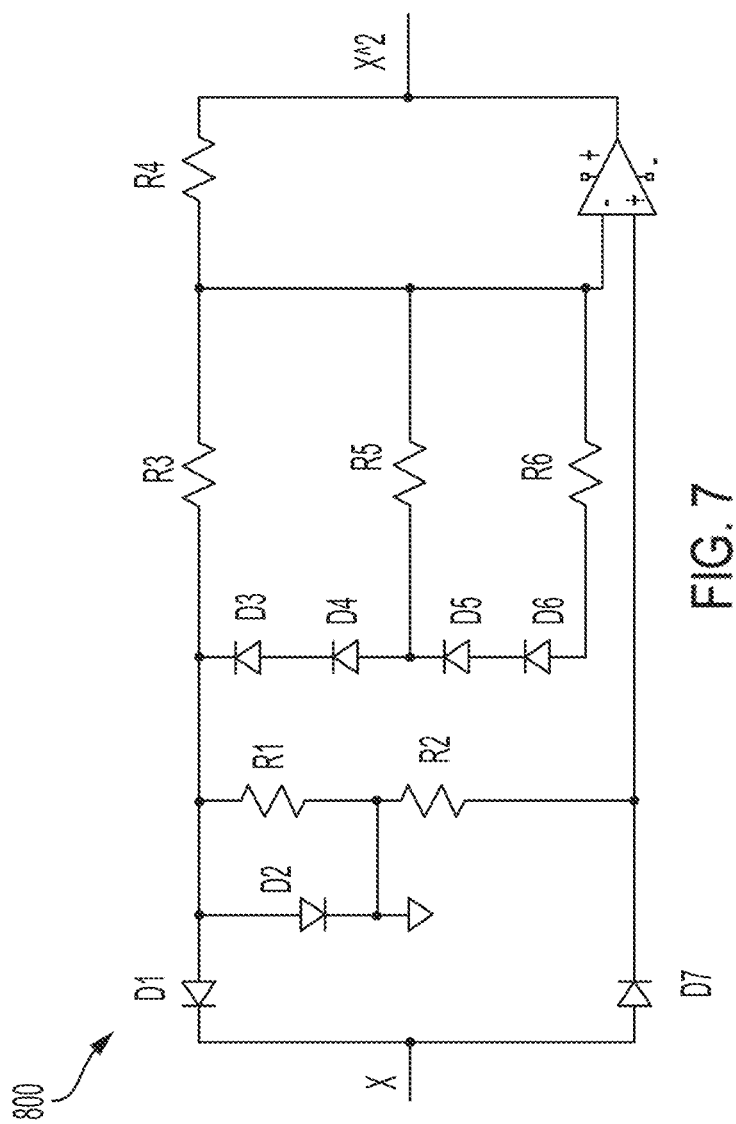
FIG. 7 is a circuit diagram of an implementation of a square function, in accordance with some embodiments.
Figure 8:
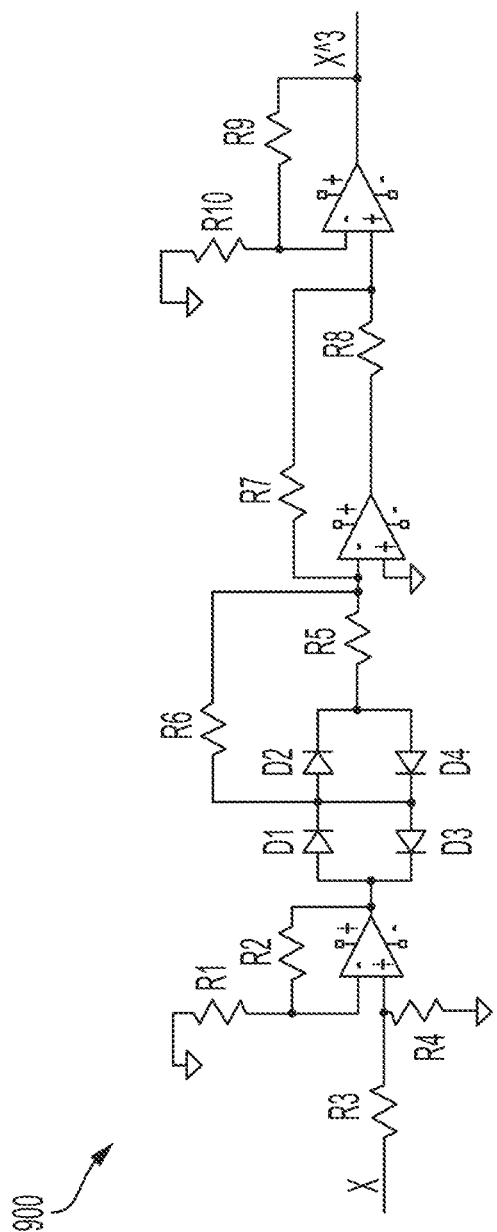
FIG. 8 is a circuit diagram of an implementation of a cube function, in accordance with some embodiments.
Figure 9:
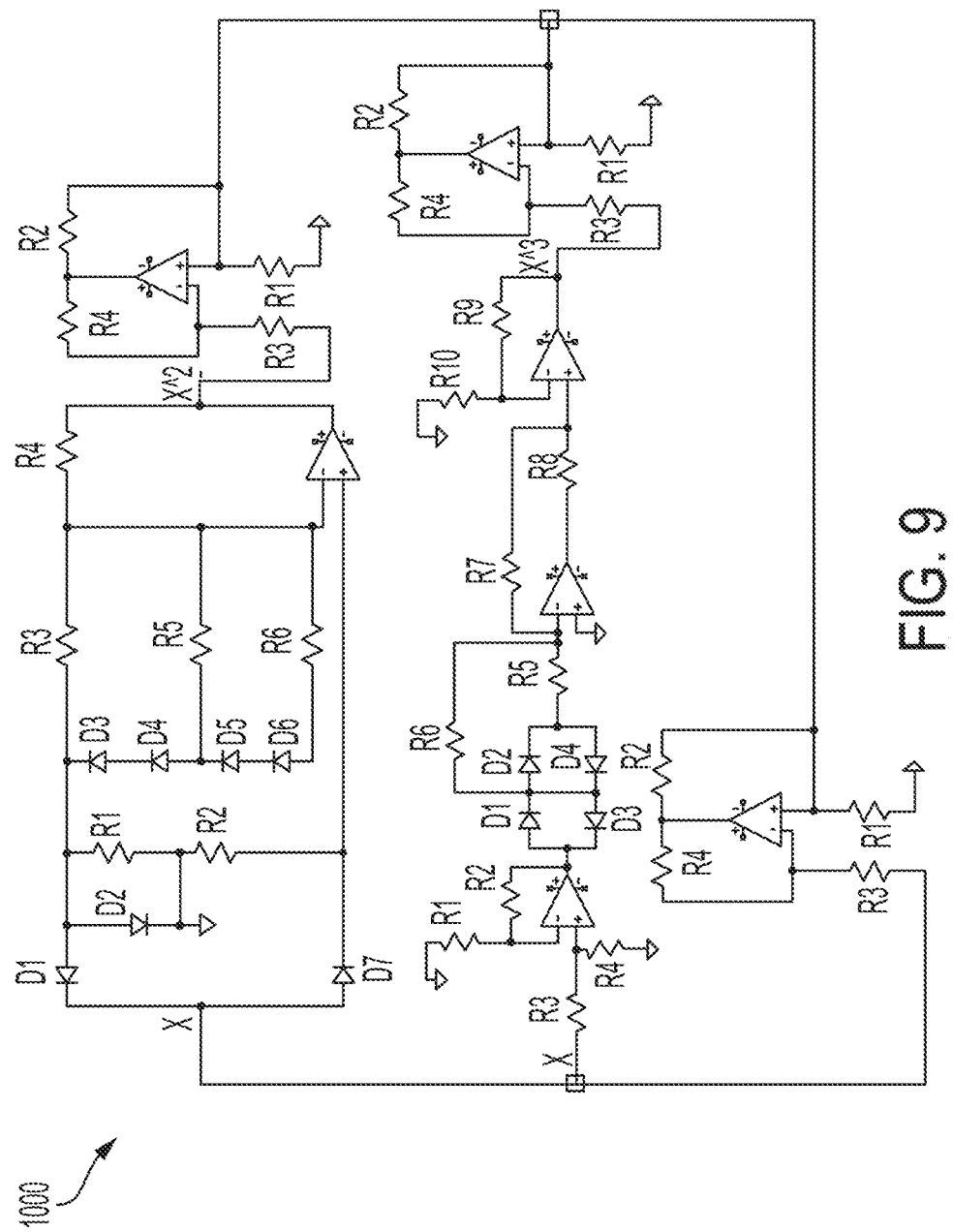
FIG. 9 is a circuit diagram of an implementation of a current source, in accordance with some embodiments.

FIG. 7 is a circuit diagram of an implementation of a square function, in accordance with some embodiments. FIG. 7 shows a circuit 800 that implements a square function for an electric potential. In one embodiment, by preceding the Howland current pump with this circuit 800, gradients that contain second order polynomials may be implemented. Using circuits that implement cube functions (e.g., circuit 900 of FIG. 8) may also be utilized. In another embodiment, a gradient of the form $g(x)=a_3x^3+a_2x^2+a_1x$ can be implemented using the circuit 1000 shown in FIG. 9. To implement cells that compute second and higher powers, another option is to use integrated circuits such as the computational unit 1100 of FIG. 10. This integrated circuit may provide precision analog multiplication, division, and exponentiation.

Figure 10:
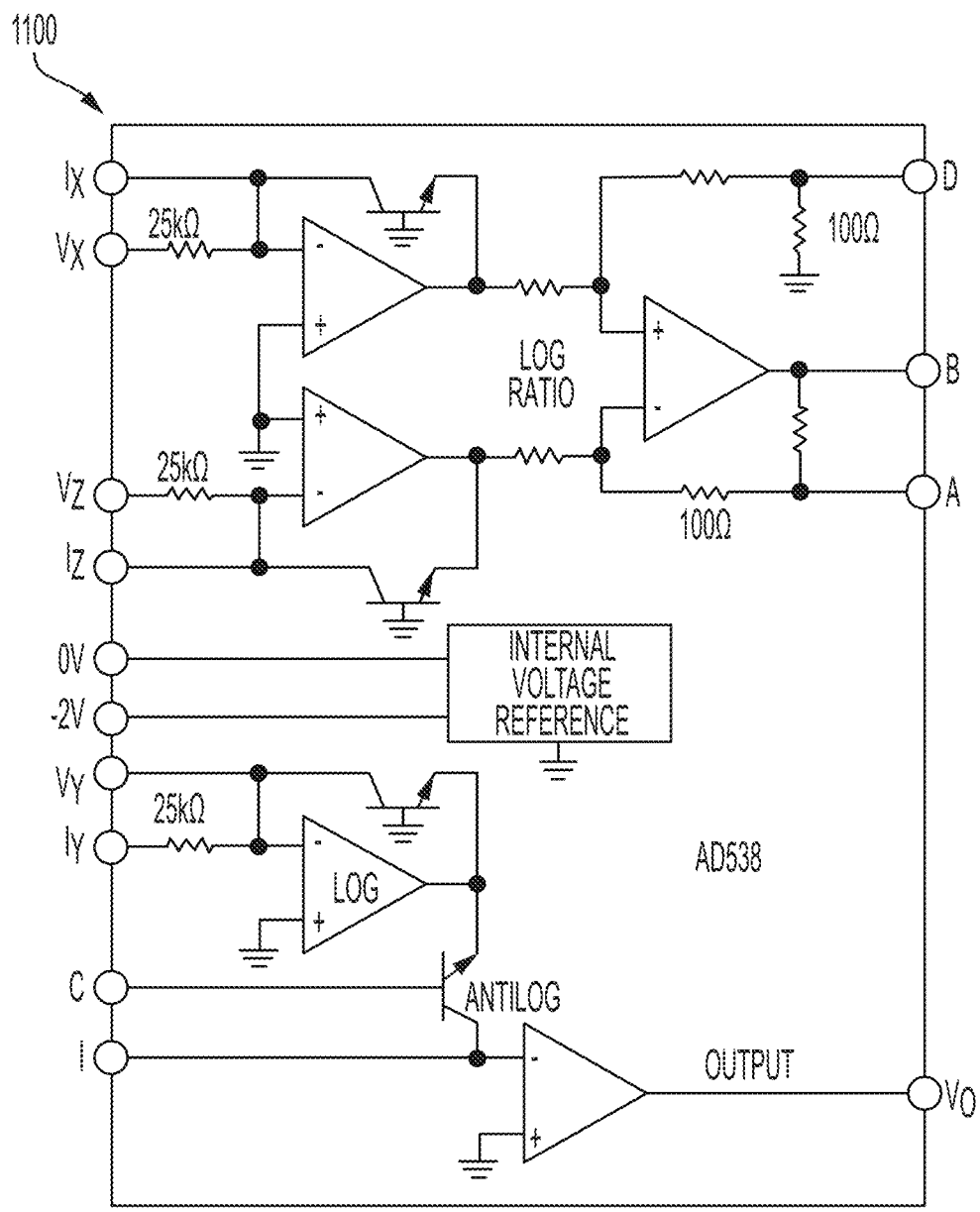
FIG. 10 is a functional block diagram of a computational unit, in accordance with some embodiments.

The functional block diagram of computational unit 1100 is shown in FIG. 10. The transfer function realized by the circuit may be $V_0=V_Y(V_Z/V_X)^m$, where m can be set to take values between 0.2 and 5, for example. In other embodiments, other suitable values may be used.

In one embodiment, to allow for programmable cost functions, the FPAA may be configured digitally. For example, in on embodiment, processing logic may receive an optimization problem to be solved (e.g., in algorithmic form) and generating, (e.g., by a processing device), a digital program for the FPAA. In one embodiment, an output of the digital program is to configure (e.g., configures) the FPAA to execute the optimization problem in an analog manner. In one embodiment, to configure the FPAA to execute the optimization problem, the output of the digital program is to configure a plurality of switches of the FPAA.

In one embodiment, the FPAA may include precision Digital-to-Analog Converters, JFET-based analog digipots and other established electronics design patterns. This may enable programming different resistance values, hence enabling the FPAA to implement various cost functions. In another embodiment, the inductors may be replaced with equivalent OP AMP based implementations to decrease the size of the circuit and improve accuracy. In one embodiment, the topologies constructed using the FPAA may be realized by acting of a set of programmable switches. The same switches may be used to charge the capacitors associated to each term in the cost function to allow for exploration of multiple initial conditions. In one embodiment, because analog circuits can calculate a solution quickly, such circuits enable testing the problem from a multitude of initial conditions. When there are several local minima, which one is arrived at first may depend on the initial conditions (e.g., initial capacitor potentials). On various embodiments, the testing many such initial conditions may be performed to determine which one gives the best result.

Figure 11:
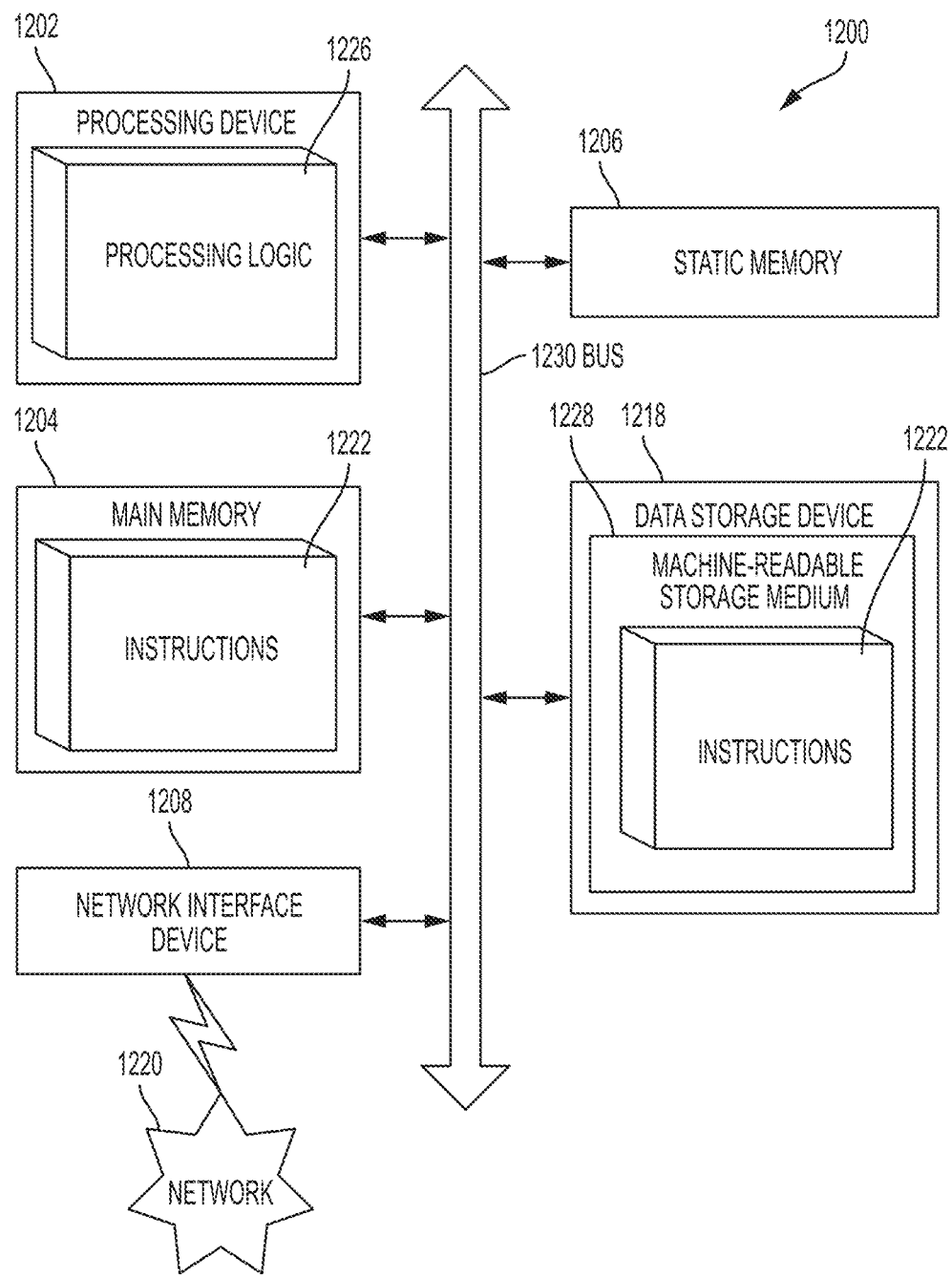
FIG. 11 illustrates a diagrammatic representation of a machine in the example form of a computer system within which a set of instructions, for causing the machine to perform any one or more of the methodologies discussed herein, may be executed.

FIG. 11 illustrates a diagrammatic representation of a machine in the example form of a computer system 1200 within which a set of instructions, for causing the machine to perform any one or more of the methodologies discussed herein, may be executed. In alternative embodiments, the machine may be connected (e.g., networked) to other machines in a local area network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, a switch or bridge, a hub, an access point, a network access control device, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. In one embodiment, computer system 1200 may be representative of an analog computer system, such as the system as described herein.

The exemplary computer system 1200 includes a processing device 1202, a main memory 1204 (e.g., read-only memory (ROM), flash memory, dynamic random access memory (DRAM), a static memory 1206 (e.g., flash memory, static random access memory (SRAM), etc.), and a data storage device 1218, which communicate with each other via a bus 1230. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Processing device 1202 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1202 may also be one or more special-purpose processing devices such as an application specific integrated circuit (ASIC), a field programmable gate array (FPGA), a field programmable analog array (FPAA), a digital signal processor (DSP), network processor, or the like. The processing device 1202 is configured to execute processing logic 1226, for performing the operations and steps discussed herein.

The data storage device 1218 may include a machine-readable storage medium 1228, on which is stored one or more set of instructions 1222 (e.g., software) embodying any one or more of the methodologies of functions described herein, including instructions to cause the processing device 1202 to execute the operations described herein. The instructions 1222 may also reside, completely or at least partially, within the main memory 1204 or within the processing device 1202 during execution thereof by the computer system 1200; the main memory 1204 and the processing device 1202 also constituting machine-readable storage media. The instructions 1222 may further be transmitted or received over a network 1220 via the network interface device 1208.

The machine-readable storage medium 1228 may also be used to store instructions to perform the methods and operations described herein. While the machine-readable storage medium 1228 is shown in an exemplary embodiment to be a single medium, the term "machine-readable storage medium" should be taken to include a single medium or multiple media (e.g., a centralized or distributed database, or associated caches and servers) that store the one or more sets of instructions. A machine-readable medium includes any mechanism for storing information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular embodiments may vary from these exemplary details and still be contemplated to be within the scope of the present disclosure.

Additionally, some embodiments may be practiced in distributed computing environments where the machine-readable medium is stored on and or executed by more than one computer system. In addition, the information transferred between computer systems may either be pulled or pushed across the communication medium connecting the computer systems.

Embodiments of the claimed subject matter include, but are not limited to, various operations described herein. These operations may be performed by hardware components, software, firmware, or a combination thereof.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent or alternating manner.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Furthermore, the terms "first," "second," "third," "fourth," etc. as used herein are meant as labels to distinguish among different elements and may not necessarily have an ordinal meaning according to their numerical designation.

It will be appreciated that variants of the above-disclosed and other features and functions, or alternatives thereof, may be combined into may other different systems or applications. Various presently unforeseen or unanticipated alternatives, modifications, variations, or improvements therein may be subsequently made by those skilled in the art which are also intended to be encompassed by the following claims. The claims may encompass embodiments in hardware, software, or a combination thereof.

What is claimed is:

1. An analog circuit for solving optimization algorithms, the analog circuit comprising:
   a plurality of voltage controlled current sources;
   a plurality of capacitors, operatively coupled in parallel to the plurality of voltage controlled current sources, respectively;
   a first inductor, operatively coupled in series between a first pair of the plurality of capacitors and the plurality of voltage controlled current sources and a second pair of the plurality of capacitors and the plurality of voltage controlled current sources; and
   a second inductor, operatively coupled in series between the second pair of the plurality of capacitors and the plurality of voltage controlled current sources and a third pair of the plurality of capacitors and the plurality of voltage controlled current sources, wherein the analog circuit is to solve the optimization algorithms with multi-variable cost functions, and wherein the multi-variable cost functions are convex, and wherein the analog circuit is to increase a probability of solving for a global minimum.

2. The analog circuit of claim 1, wherein the analog circuit is to solve the optimization algorithms in less than 500 nanoseconds.

3. An analog circuit for solving optimization algorithms, the analog circuit comprising:
   a plurality of voltage controlled current sources;
   a plurality of capacitors, operatively coupled in parallel to the plurality of voltage controlled current sources, respectively;
   a first inductor, operatively coupled in series between a first pair of the plurality of capacitors and the plurality of voltage controlled current sources and a second pair of the plurality of capacitors and the plurality of voltage controlled current sources; and
   a second inductor, operatively coupled in series between the second pair of the plurality of capacitors and the plurality of voltage controlled current sources and a third pair of the plurality of capacitors and the plurality of voltage controlled current sources, wherein the analog circuit is to solve the optimization algorithms as part of a model-predictive control scheme.

4. The analog circuit of claim 3, wherein the analog circuit is to solve the optimization algorithms in less than 500 milliseconds.

5. The analog circuit of claim 3, wherein the analog circuit is implemented by a field programmable analog array (FPAA).

6. The analog circuit of claim 5, wherein the FPAA is configured digitally.

7. A field programmable analog array (FPAA) for solving optimization algorithms, configured to comprise:
   a plurality of voltage controlled current sources;
   a plurality of capacitors, each capacitor operatively coupled in parallel to one of the plurality of voltage controlled current sources, respectively, to form a plurality of voltage controlled current source and capacitor pairs; and
   a plurality of energy-storage components, each energy-storage component of the plurality of energy-storage components operatively coupled in series between the plurality of voltage controlled current source and capacitor pairs, wherein the plurality of energy-storage components is a plurality of operational amplifiers.

8. The FPAA of claim 7, wherein the plurality of energy-storage components is a plurality of capacitors.

9. The FPAA of claim 7, wherein the FPAA is to solve the optimization algorithms in less than 500 milliseconds.

10. The FPAA of claim 9, wherein the FPAA is to solve the optimization algorithms in less than 500 nanoseconds.

11. The FPAA of claim 7, wherein the FPAA is to solve distributed optimization algorithms.

12. The FPAA of claim 7, wherein the FPAA is to solve the optimization algorithms with multi-variable cost functions.

13. The FPAA of claim 12, wherein the FPAA is to increase a probability of solving for a global minimum when the multi-variable cost functions are convex.

14. The FPAA of claim 7, wherein the FPAA is configured digitally.

15. A method comprising:
    receiving an optimization problem to be solved; and
    generating, by a processing device, a digital program for a field programmable analog array (FPAA) to increase a probability of solving for a global minimum when the multi-variable cost functions are convex, wherein an output of the digital program is to digitally configure the FPAA to execute the optimization problem in an analog manner, wherein the digital program controls a plurality of energy-storage components, each energy-storage component of the plurality of energy-storage components operatively coupled in series between a plurality of voltage controlled current source and capacitor pairs.

16. The method of claim 15, wherein the FPAA is to solve the optimization problem in less than 500 nanoseconds.

17. The method of claim 15, wherein the FPAA is configured digitally.

18. The method of claim 15, wherein the plurality of energy-storage components is at least one of a plurality of capacitors or a plurality of operational amplifiers.

* * * * *